(12) United States Patent
Briefer

(10) Patent No.: US 6,316,948 B1
(45) Date of Patent: Nov. 13, 2001

(54) CHARGE BALANCE NETWORK WITH FLOATING GROUND CAPACITIVE SENSING

(75) Inventor: Dennis K. Briefer, Marlborough, MA (US)

(73) Assignee: Setra Systems, Inc., Boxborough, MA (US)

( * ) Notice: Subject to any disclaimer, the term of this patent is extended or adjusted under 35 U.S.C. 154(b) by 0 days.

(21) Appl. No.: 09/108,659

(22) Filed: Jul. 1, 1998

(51) Int. Cl.[7] .................................................. G01R 27/26
(52) U.S. Cl. ........................... 324/678; 324/660; 324/661
(58) Field of Search .................................. 324/678, 661, 324/660, 679, 680

(56) References Cited

U.S. PATENT DOCUMENTS

| | | |
|---|---|---|
| 3,048,775 | 8/1962 | Calvert . |
| 4,054,833 | 10/1977 | Briefer . |
| 4,736,629 * | 4/1988 | Cole ....................................... 324/678 |
| 5,083,091 * | 1/1992 | Frick ....................................... 324/678 |

* cited by examiner

Primary Examiner—Safet Metjahic
Assistant Examiner—Anjan Deb
(74) Attorney, Agent, or Firm—McDermott, Will & Emery

(57) ABSTRACT

A capacitance measurement system amenable to implementation on an integrated circuit includes a switching network, a voltage driving element, a sensor network, and a feedback network. The sensor network includes a fixed capacitor connected in series to a variable sensing capacitor. The feedback network receives the voltage generated at the junction node between the two capacitors, and the other side of the sensor capacitor is connected to system ground. The voltage driving element, responsive to a signal from the switching network, shifts the local voltage which supplies power to the feedback network. The feedback network generates a feedback signal representative of the difference in the charge stored on the series capacitors from a predetermined value. The switching network includes a control which is operative to cyclically interconnect the feedback signal and reference potentials with the sensor network and the voltage driving element, whereby the average change in the charge stored on the capacitors over each cycle is substantially equal to the predetermined value. In this configuration, the feedback signal is a predetermined function of capacitance of the sensing capacitor.

23 Claims, 6 Drawing Sheets

CHARGE BALANCE NETWORK WITH FLOATING GROUND CAPACITIVE SENSING

CROSS-REFERENCE TO RELATED APPLICATIONS

Not Applicable

STATEMENT REGARDING FEDERALLY SPONSORED RESEARCH

Not Applicable

REFERENCE TO MICROFICHE APPENDIX

Not Applicable

FIELD OF THE INVENTION

This invention relates to measurement systems, and more particularly, to capacitance measurement systems having attributes which make the system amenable to implementation on an integrated circuit.

BACKGROUND OF THE INVENTION

Many forms of prior art capacitance measurement systems utilize a capacitive bridge configuration to produce a signal representative of the relative capacitances associated with sensor and reference capacitors in the bridge. Other forms in the prior art include systems exemplified by U.S. Pat. No. 3,048,775 wherein a capacitive sensor is configured in the feedback path around an A.C. amplifier driven by a reference A.C. signal, and wherein the amplifier output is demodulated using a diode detector.

While such prior art capacitance measurement systems are suited for certain uses as accelerometers, scales and balances, proximity detectors, linear and angular position sensors, and pressure transducers, the prior art systems are substantially limited in accuracy and sensitivity of their respective measurements due to a number of factors, including temperature variation, stray or leakage capacitance, non-linearities in the transducer configurations, noise, and drift. Furthermore, many prior art systems are limited to certain operational frequencies.

Another prior art form is described and claimed in U.S. Pat. No. 4,054,833, entitled CAPACITANCE MEASURING SYSTEM, which is hereby incorporated by reference, and is referred to as the '833 patent herein. In the '833 patent, a sensor network, including series connected capacitors, is utilized with a switching network in a feedback configuration to generate the signal which is a predetermined function of the capacitance of the sensor capacitor. In one form disclosed in the '833 patent, the feedback signal is a linear function of the reciprocal of the capacitance of the sensor capacitor. In another form, the feedback signal is a linear function of the capacitance of the sensor capacitor.

The switching network includes a two state switch and a control for cyclically controlling the switch to flip between its two states. A means is provided to couple a plurality of reference potentials to various terminals of the switch, to the feedback network, and in some embodiments to the sensor network.

The feedback network is coupled to both the sensor and switching networks, and provides a feedback signal representative to the difference in charge stored on the series capacitors from a predetermined value.

The switching network is operative to cyclically interconnect the feedback network and sensor network with the feedback signal and external reference potentials in a manner whereby the average charge stored on the series capacitors over each cycle is substantially equal to the predetermined value.

In one form disclosed in the '833 patent, the feedback network includes a differential amplifier coupled to the junction of the series capacitors in a null-seeking configuration. Additionally, the amplifier output may be directed by way of a demodulator to provide the feedback signal. The demodulator in such embodiments may be a synchronous demodulator, operating synchronously with the switch control in the switching network.

In null-seeking configurations such as the one described in FIG. 8 and FIG. 9 of the '833 patent, the feedback nulling of the error signal at the junction between the sensor and reference capacitors virtually eliminates the effect of any leakage capacitance which might be present. As a result, such configurations may readily be utilized with a remote sensor having one terminal at system ground potential.

However, in order to implement the null-seeking configuration with a remote sensor having one terminal at system ground potential, the configuration disclosed in the '833 patent decouples the power supply rails of the amplifier network from the primary system voltage and ground references. Although the potential difference across the amplifier network supply terminals remains substantially constant, the voltages at each such terminal may be offset at any given time with respect to the system ground potential. Since the components used to accomplish this decoupling are relatively large in physical size, the null-seeking technique described in the '833 patent is not conducive to implementation on an integrated circuit.

It is an object of the present invention to provide an improved capacitance measuring system wherein a signal is generated which is a predetermined function of the capacitance of a sensor capacitor, where the sensing capacitor is coupled to system ground potential.

A further object is to provide an improved capacitance measuring system which is relatively insensitive to temperature variation, stray or leakage capacitance, noise, drift and operational frequency, and which is amenable to integrated circuit implementation.

Other objects of the present invention will in part be evident and will in part appear hereinafter. The invention accordingly comprises the apparatus possessing the construction, combination of elements, and arrangement of parts exemplified in the following detailed disclosure, and the scope of the application of which is indicated in the claims.

SUMMARY OF THE INVENTION

The present invention is directed to a system for generating a signal which is a predetermined function of the capacitance of a sensor capacitor. The system is coupled to a system voltage source which generates a substantially constant first voltage with respect to a system ground, and also to a local voltage source which generates a substantially constant second voltage with respect to a local ground. The local ground is substantially decoupled from the system ground such that the local voltage source and local ground may be driven independently from the system ground, creating what is known in the art as a driven ground or equivalently a driven voltage source. The system includes a sensor network with two series connected capacitors, one of these series capacitors being the sensor capacitor having one terminal electrically connected to said system ground. The system further includes a switching network with a switch element having two states and a switch control operative to cyclically switch the switch element between the two states. The system also includes a coupling element operative to couple at least one of a plurality of reference potentials to the switching element. The system also includes a feedback network, coupled to the sensor network and switching network, which generates a feedback signal at a feedback terminal representative of the difference in charge stored on the series capacitors from a predetermined value. The system further includes a voltage driving element which regulates the local voltage source. The voltage driving element is responsive to at least one of a plurality of signals from the switching network.

The switching network is operative to cyclically interconnect the feedback network and sensor network with the feedback terminal and to cyclically offset the local voltage source, whereby the average change in the charge stored on the series capacitors over each cycle is substantially equal to the predetermined value, the feedback signal being the predetermined function of the capacitance of the sensor capacitor.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE PREFERRED EMBODIMENT

The present invention is directed to a capacitive measuring system which is amenable to implementation on integrated circuits, for example, on silicon monolithic integrated circuits.

Figure 1:
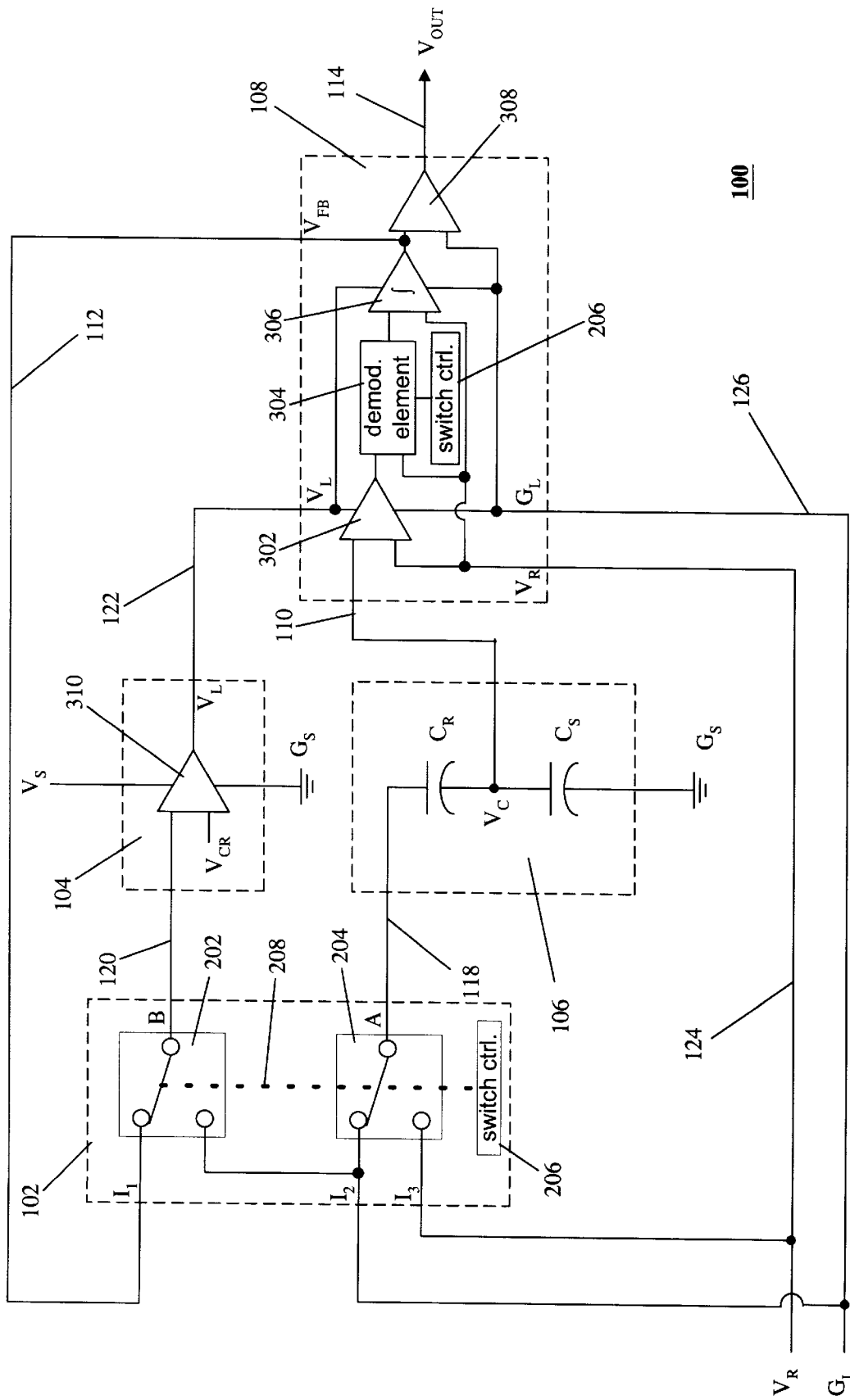
FIG. 1 shows, in schematic form, a capacitive measuring system according to the present invention.

FIG. 1 illustrates an exemplary embodiment of the present invention in schematic form. The capacitive measuring system 100 includes a switching network 102, a voltage driving element 104, a sensor network 106, and a feedback network 108. Sensor network 106 includes a pair of series connected capacitors, a reference capacitory $C_R$ and a sensing capacitor $C_S$. The junction point between these capacitors is at the voltage $V_C$ and is connected by way of signal conductor 110 as a first input to the feedback network 108. The feedback network 108 provides a feedback signal $V_{FB}$ by way of feedback conductor 112 to an output terminal 114, and also as a first input $I_1$ to the switching network 102. Switching network 102 provides a first output signal A which is connected by way of signal conductor 118 to the sensor network 106, and a second output signal B which is connected by way of signal conductor 120 to the voltage driving element 104. The voltage driving element 104 provides a local voltage source $V_L$ which is connected by way of conductor 122 as an upper voltage supply rail of feedback network 108. A reference voltage $V_R$ is connected by way of conductor 124 as a second input $I_2$ to switching network 102, and also as a third input to feedback network 108. A second reference potential $G_L$ is connected by way of conductor 126 as a third input $I_3$ to switching network 102, and also as a fourth input to feedback network 108. In one embodiment, the reference voltage $G_L$ is fixed at a constant, predetermined voltage below $V_L$ via a voltage regulator associated with the feedback network 108. One preferred embodiment uses a zener diode to effect the voltage regulator, although those skilled in the art will recognize that other methods of maintaining a fixed, constant voltage between $V_L$ and $G_L$ are possible. Unless noted otherwise, all reference voltages are defined with respect to system ground $G_S$.

The feedback network 108 generates a feedback signal representative of the difference in the charge stored on the series capacitors $C_R$ and $C_S$ from a predetermined value. The switching network 102 includes a control 206 which is operative to cyclically interconnect the feedback conductor 112 and the reference potentials $V_R$ and $G_L$ with the sensor network 106, and the voltage driving element 104 by way of lines 118 and 120, whereby the average change in the charge stored on the capacitors $C_R$ and $C_S$ over each cycle is substantially equal to the predetermined value. In this configuration, the feedback signal $V_{FB}$ is a predetermined function of capacitance of the capacitor $C_S$.

FIG. 1 further shows an exemplary embodiment of the switching network 102, which includes a double pole, double throw (hereinafter referred to as DPDT) switch. The DPDT switch includes coupled switches 202 and 204 and a switch control element 206. The switch coupling is indicated by the dashed line 208. It will be understood that the DPDT switch may take the form of a solid state switching element, for example, using a conventional field effect transistor (hereinafter referred to as FET) configuration. Alternative forms of the DPDT switch may be readily substituted in keeping with the present invention.

The feedback signal $V_{FB}$ and the reference voltages $V_R$ and $G_L$ are coupled to the signal lines 118 and 120 via switches 202 and 204. This coupling is illustrated by the solid lines, indicative of a voltage coupler. In the illustrated embodiment of the invention, switches 202 and 204 are controlled to synchronously switch between two operative states by a switch control 206. Switch control 206 may be any suitable means for driving the switches 202 and 204 together from one operative state to the other. In the first state, the switch 202 connects signal conductor 120 to feedback voltage $V_{FB}$ and switch 204 connects signal conductor 118 to reference voltage $G_L$. In the second state, switch 202 connects signal conductor 120 to reference voltage $G_L$ and switch 204 connects signal conductor 118 to reference voltage $V_R$ via conductor 112. In alternative embodiments the switch control 206 may be further coupled to the feedback network 108, as described more fully in the '833 patent, to permit synchronous demodulation in the feedback network 108.

In the switching network 102, the switching elements 202 and 204 are cyclically switched so that their poles are alternately connected between their associated terminals, whereby the configuration of FIG. 1 maintains an average change in the charge stored on the series capacitors $C_R$ and $C_S$ over each cycle substantially equal to the predetermined value. In this configuration, the signal at the junction of the capacitors $C_R$ and $C_S$ is representative of an "error" signal corresponding to the difference in charge stored on those capacitors from a predetermined value. That "error" signal may, for example, be representative of the change in pressure across the diaphragm of a capacitive pressure transducer of the type shown in U.S. Pat. No. 4,358,814.

Further shown in FIG. 1, the feedback network 108 includes a first differential amplifier 302, a demodulation element 304, an integrator 306 and a second differential amplifier 308. The first differential amplifier 302 receives the voltage $V_C$ from the junction point between capacitors $C_R$ and $C_S$ by way of conductor 110, and also receives the reference voltage $V_R$. The first differential amplifier 302 produces an error signal representative of the difference between the voltage $V_C$ and the reference voltage $V_R$. The demodulation element 304 receives and processes the error signal for subsequent integration by the integrator 306. Information regarding architecture and functionality of the demodulation element 304 for both synchronous and non-synchronous demodulation is set forth in detail in the '833 patent. After the integrator 306 integrates the processed error signal, the second differential amplifier 308 receives the integrated signal, along with the reference voltage $G_L$. The second differential amplifier 308 produces an output signal $V_{OUT}$ which is representative of the difference between the integrated signal and the reference voltage $G_L$.

In the illustrated embodiment of the invention, the voltage driving element 104 provides the upper voltage supply rail $V_L$ from which the first differential amplifier 302 and the integrator 306 operate. The first differential amplifier 302 and the integrator 306 use the local ground reference potential $G_L$, to which $V_L$ is referenced, as a lower voltage supply rail. The second differential amplifier 308 receives $G_L$ as one of its differential inputs. The voltage driving element 104 is driven by an output of switching network 102 via conductor 120. In general, the voltage driving element 104 produces a voltage at its output as a function to the voltage presented at its input.

Figure 5:
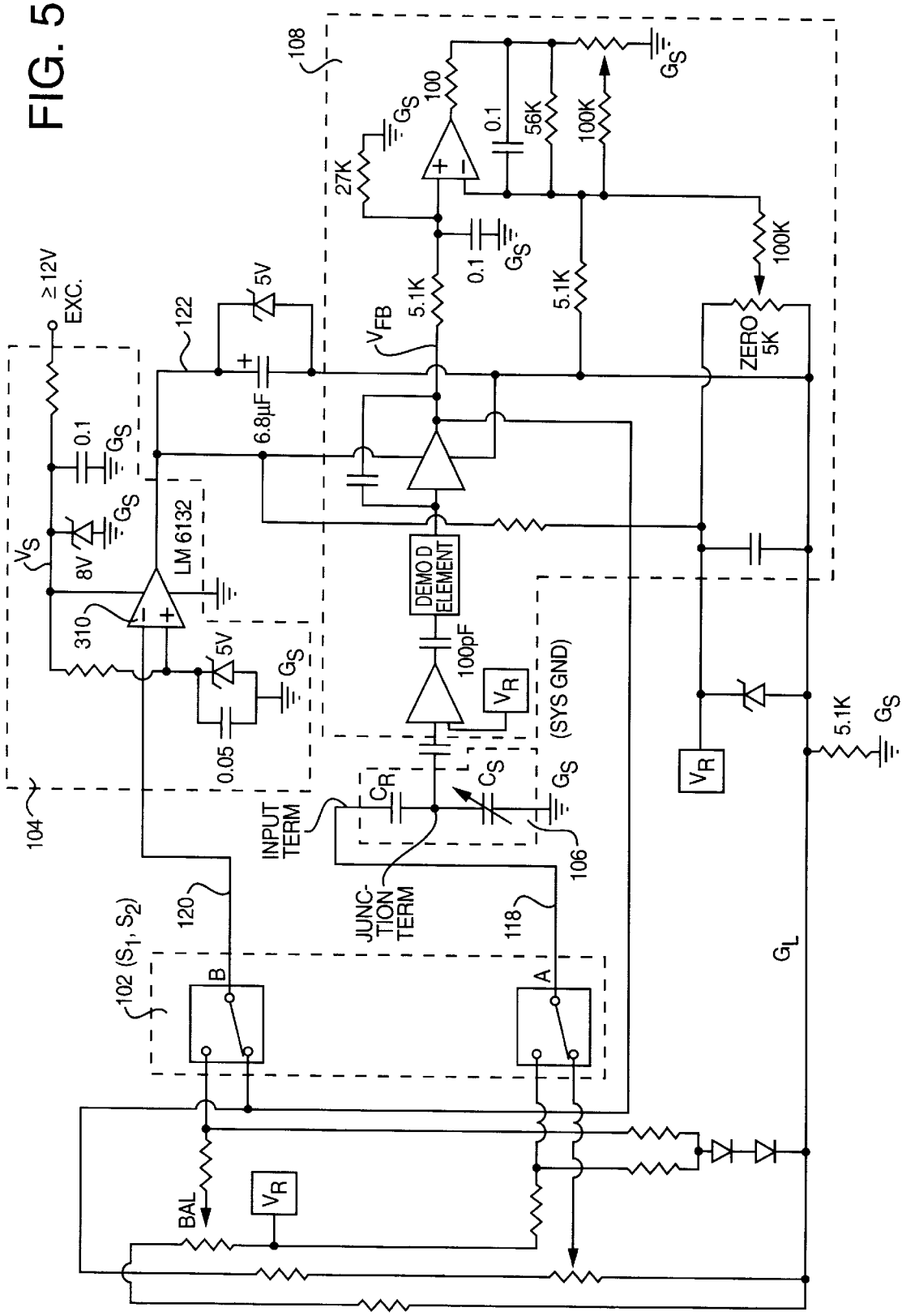
FIG. 5 shows, in schematic form, one embodiment of the system of FIG. 1.

FIG. 5 further shows an exemplary embodiment of the voltage driving element 104, which includes an operational amplifier 310, such as the National Semiconductor LM6132, with the inverting input electrically connected to signal conductor 120, and the non-inverting input electrically connected to a constant reference voltage $V_{CR}$. In one embodiment of the invention, the voltage driving element 104 generates the constant reference voltage $V_{CR}$ from $V_S$ via a zener diode, although other methods of generating a reference voltage known in the art may be used. The operational amplifier 310 provides an output voltage on conductor 122 such that the difference voltage at the input of amplifier 310 is very low. The particular relationship between the input to the voltage driving element 104 and the output of the voltage driving element is thus determined by the value of the constant reference voltage $V_{CR}$ and the signal voltage on line 120 (switching network output B). Those skilled in the art will realize that other methods may be used to implement the voltage driving element 104.

In the illustrated embodiment, the switching network 102 cyclically exists in one of two states, which produces one of two voltages at the input of voltage driving element 104 via conductor 120, resulting in one of two voltages at the output of voltage driving element 104. Cyclically shifting the voltage across the first operational amplifier 302 and the integrator 306 with respect to $G_S$, along with cyclically coupling $V_{FB}$ and $G_L$ to the sensor network 106 via switching network 102 is operative to store an average charge on the capacitors $C_R$ and $C_S$ equal to the predetermined value. In this configuration with $C_R$ being a fixed capacitor and $C_S$ being a variable capacitor having capacitance which varies with an external parameter (such as pressure applied to a capacitive sensor), a substantially constant average change in charge over a cycle is maintained on the capacitor $C_R$, while the feedback voltage $V_{FB}$ is varied by the feedback network 108 with the variations in the capacitance of capacitor $C_S$ in order to maintain the average change in charge over a cycle on capacitor $C_S$ to equal a constant. Thus, the feedback signal $V_{FB}$ is a linear function of the reciprocal of that capacitance (i.e., $C_S$). Where $C_S$ is substantially a parallel plate capacitor, $V_{FB}$ is a linear function of the gap between the plates of $C_S$.

Figure 2A:
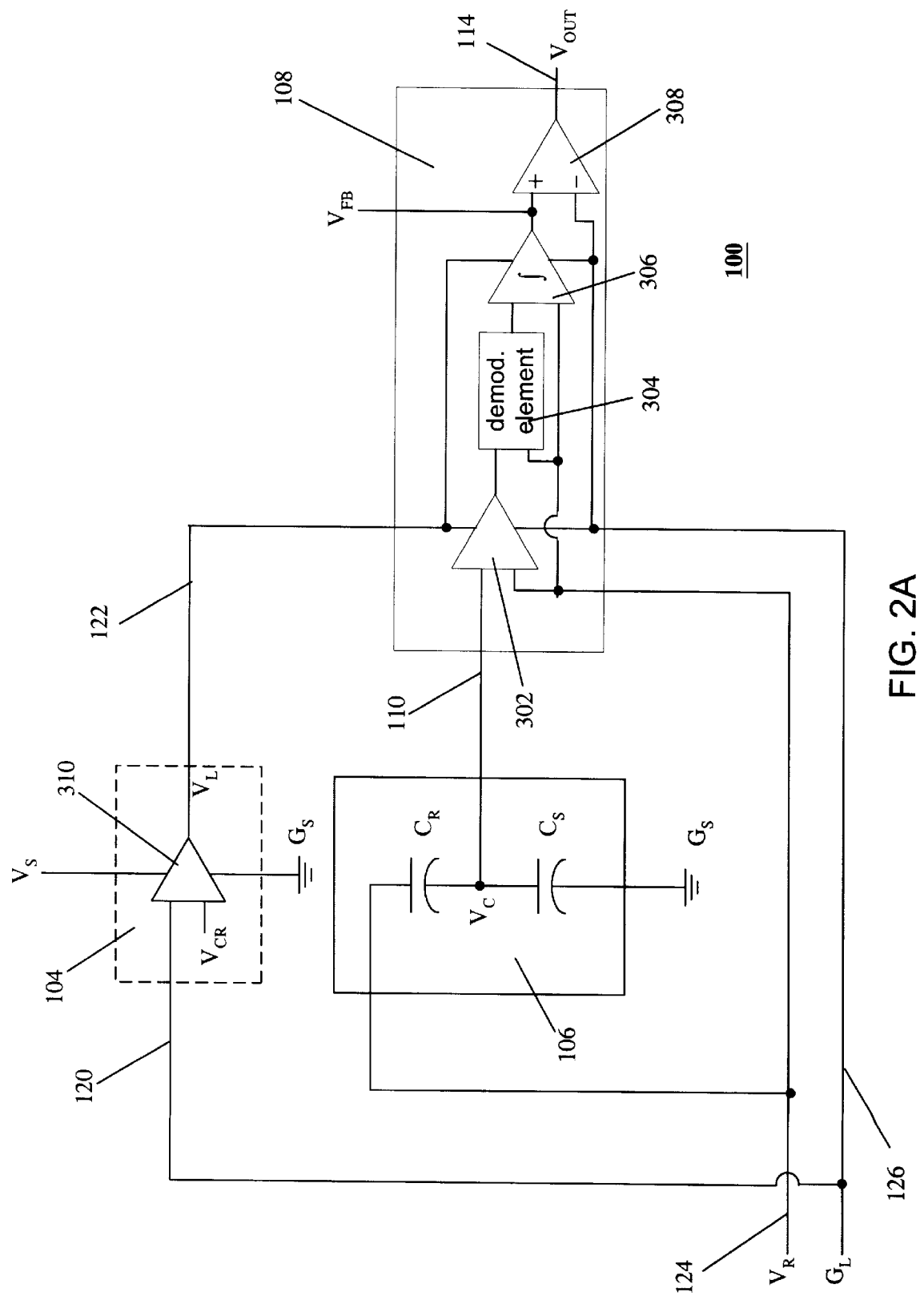
FIG. 2A shows, in schematic form, the system of FIG. 1 when the switching network is in a first state.
Figure 2B:
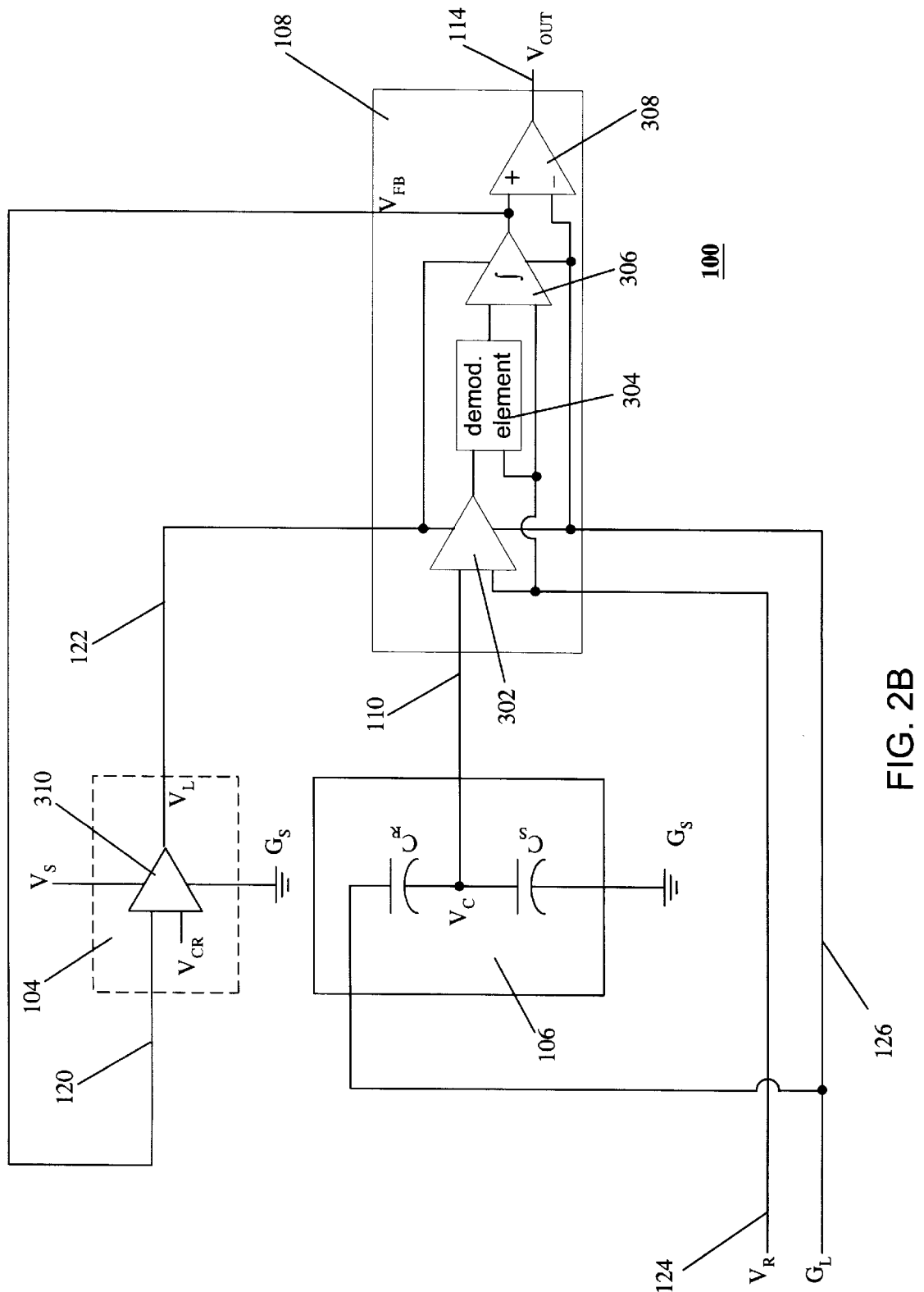
FIG. 2B shows, in schematic form, the system of FIG. 1 when the switching network is in a second state.

In operation, the invention is alternately configured as shown in FIG. 2A when the switching network 102 is in the first operative state, and as shown in FIG. 2B when the switching network 102 is in the second operative state. FIGS. 2A and 2B illustrate that the input to the voltage driving element 104 alternates between $G_L$ and $V_{FB}$, while the voltage across the sensing network 106 alternates between $V_{FB}$ and $G_L$, respectively. In the first state, when the voltage driving element 104 receives $G_L$, the voltage driving element 104 produces a voltage output on line 122 such that the change in ($V_{CR}-G_L$) during switching is small. In the second state, when the voltage driving element 104 receives $V_{FB}$, the voltage driving element 104 produces a voltage of ($V_{CR}-V_{FB}$), on output conductor 122. By shifting the supply rails of the feedback network as a part of and in addition to the cyclic coupling procedure implemented by prior art systems, the present invention generates a feedback signal $V_{FB}$ representative of the sensing capacitor $C_S$ while utilizing reactive components (i.e., capacitors and inductors) with values conducive to implementation on an integrated circuit.

Figure 3:
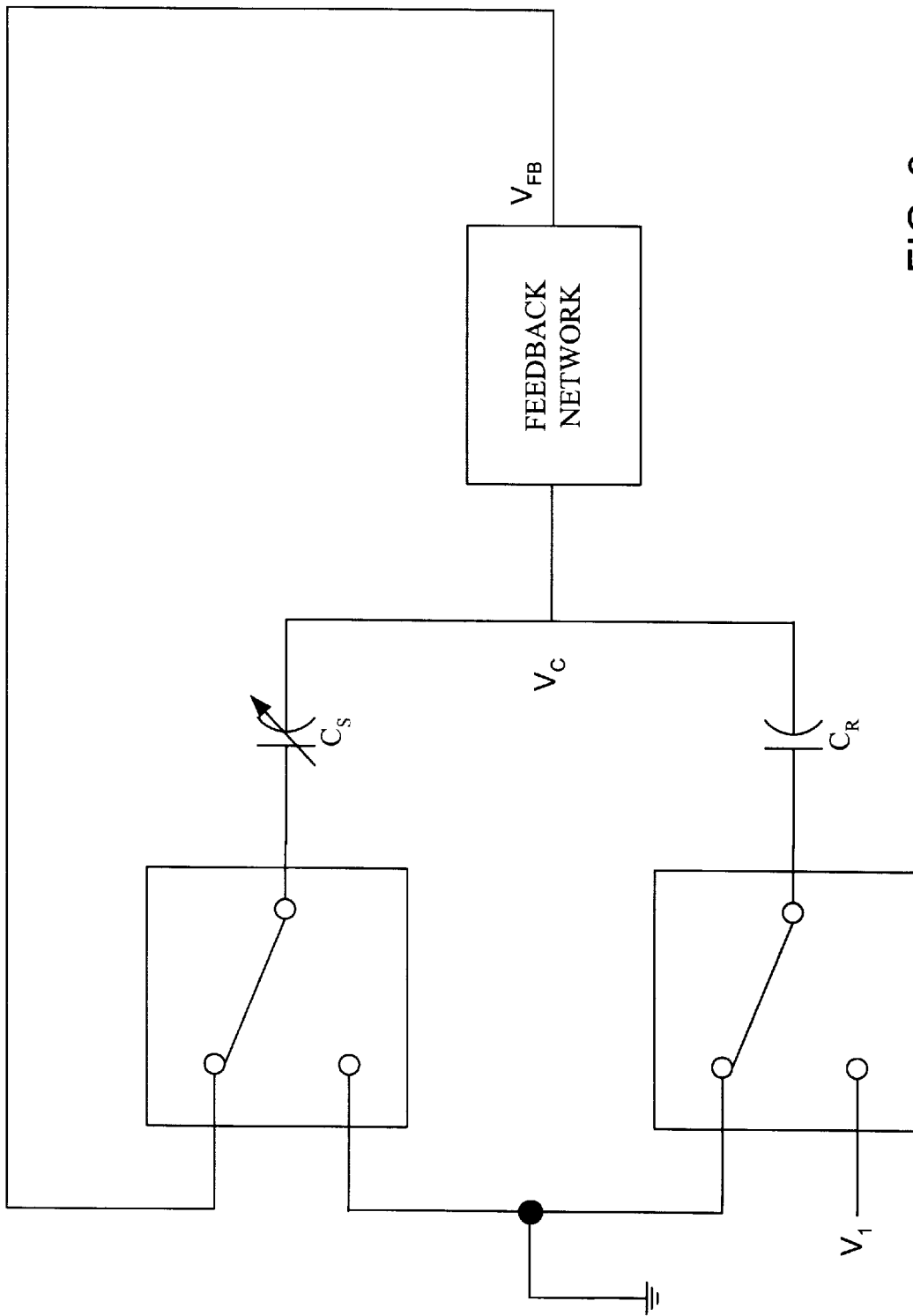
FIG. 3 shows, in schematic form, the relevant components of one embodiment of the '833 patent.
Figure 4B:
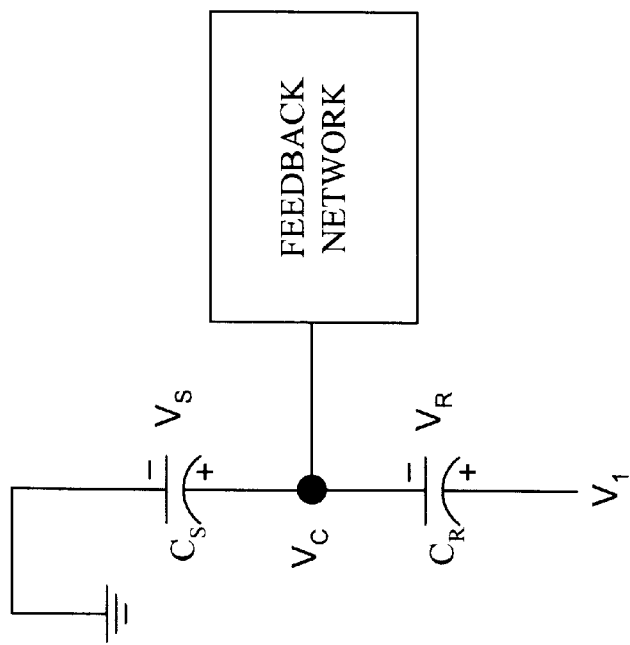
FIG. 4B shows, in schematic form, the voltages on $C_S$ and $C_R$ of FIG. 3 when the switch network is in a second state.
Figure 4A:
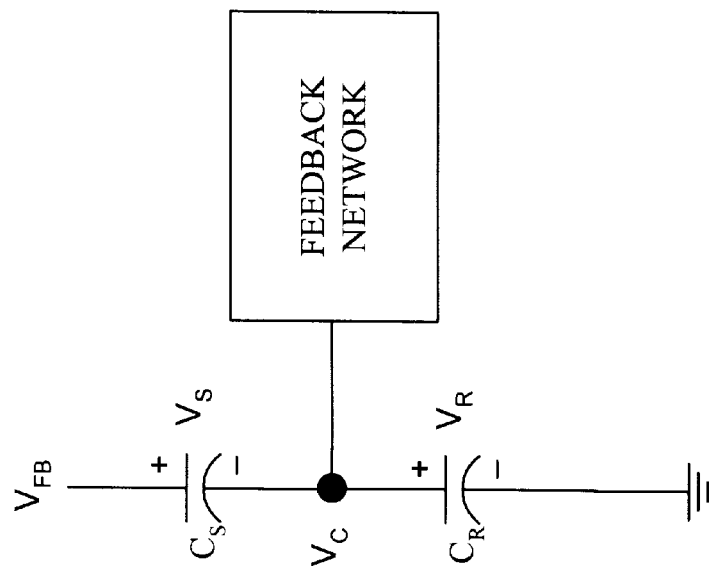
FIG. 4A shows, in schematic form, the voltages on $C_S$ and $C_R$ of FIG. 3 when the switch network is in a first state.

In order to more fully understand the present invention, it is helpful to compare its operation to the operation of the prior art capacitance measuring system described in FIG. 1 of the '833 patent. FIG. 3 shows, in schematic form, the relevant components of one embodiment of the '833 patent. FIG. 4A shows, in schematic form, the voltages on $C_S$ and $C_R$ when the switch network is in a first state, and FIG. 4B shows, in schematic form, the voltages on $C_S$ and $C_R$ when the switch network is in a second state. Because of the series configuration of $C_S$ and $C_R$, current flows equally into the two capacitors when $V_{FB}$ is applied as shown in FIG. 4A, until the voltages $(V_S+V_R)=V_{FB}$. Since the same current flows into each capacitor, the resulting charge $Q_{FB}$ on each capacitor must be the same. Therefore the voltages across the capacitors may be expressed as:

$$\frac{Q_{FB}}{C_S} + \frac{Q_{FB}}{C_R} = V_{FB}$$

When $V_1$ is applied as shown in FIG. 4B an equal current flows into each capacitor until the voltages $V_s+V_R = V_1$. Again, since the same current flows into each capacitor, the resulting charge $Q_1$ on each capacitor must be the same. Therefore the voltages across the capacitors may be expressed as:

$$\frac{Q_1}{C_S} + \frac{Q_1}{C_R} = V_1$$

Note that in FIG. 4A, the voltage presented to the feedback network (i.e., $V_C$) with respect to ground is $Q_{FB}/C_R$, and in FIG. 4B, and the voltage presented to the feedback network with respect to ground is $Q_1/C_S$. An AC null existing at the input to the feedback network means that the voltage $V_C$ presented to the feedback network remains constant as the switching network alternates the configuration of the capacitors between that shown in FIG. 4A and FIG. 4B. Therefore for an AC null to occur, the following must be true:

$$\frac{Q_{FB}}{C_R} = \frac{Q_1}{C_S}.$$

Since $Q_{FB}$ may be expressed as $$Q_{FB} = V_{FB} \frac{(C_S C_R)}{(C_S + C_R)},$$

and $Q_1$ may be expressed as $$Q_1 = \frac{V_1 (C_S C_R)}{(C_S + C_R)}$$

the condition for an AC null may be written as $$\frac{\frac{V_1(C_S C_R)}{(C_S + C_R)}}{C_S} = \frac{\frac{V_{FB}(C_S C_R)}{(C_S + C_R)}}{C_R}, \text{ or } V_{FB} = \frac{V_1 C_R}{C_S}$$

Thus, since $C_R$ and $V_R$ are constants when an AC null occurs at $V_C$, the feedback voltage $V_{FB}$ is a function of the inverse of $C_S$.

The present invention also uses a switching network to place $C_R$ and $C_S$ in two different voltage configurations. Referring to FIGS. 2A and 2B, in a first state the switching network 106 places a voltage ($V_R$–$G_S$) across the capacitors $C_R$ and $C_S$, corresponding to the voltage placed across the series capacitors of the '833 patent shown in FIG. 4B. In this first state, the voltage driving element 104 provides a voltage of ($V_{CR}$–$G_L$) to the upper voltage supply rail of feedback network 108 via output conductor 122. In a second state, the switching network 106 places a voltage $G_L$–$G_S$ across the capacitors $C_R$ and $C_S$. In other words, the upper voltage supply rail $V_L$ shifts by –$V_{FB}$ with respect to system ground $G_S$. As noted hereinbefore, the voltage across the feedback network 108, i.e., ($V_L$–$G_L$), is maintained at a constant, predetermined voltage by a regulator associated with the feedback network 104. In a preferred embodiment, the predetermined voltage is selected such that $G_L$=$G_S$ when $V_L$=$V_{CR}$, which is the case when the switching network is in the first state. When the switching network 102 changes from the first state to the second state, the voltage across the feedback network 104 shifts by –$V_{FB}$ with respect to system ground $G_S$. In the second state, since the voltage across $C_R$ and $C_S$ is ($G_L$–$G_S$), and since the voltage $G_L$ is ($G_S$–$V_{FB}$), the voltage across the capacitors $C_R$ and $C_S$ corresponds to the voltage placed across the series capacitors of the '833 patent shown in FIG. 4A. Thus, the invention operates to null the AC signal $V_C$ at the junction of $C_R$ and $C_S$ by driving the voltage across the feedback network 108, producing a feedback signal $V_{FB}$ which is proportional to the inverse of the sensing capacitor $C_S$.

As shown in FIG. 1, the integrator 306 produces the feedback signal $V_{FB}$. Since the voltage driving element 104 cyclically offsets the supply voltage $V_L$ to the integrator 306, the feedback signal $V_{FB}$ exhibits the same cyclic voltage offset as the supply voltage $V_L$. To remove this residual cyclic voltage offset, the integrator 306 provides the feedback signal $V_{FB}$ to the second differential amplifier 308, which subtracts the voltage $G_L$ from the feedback signal $V_{FB}$. The supply voltage to second differential amplifier is constant with respect to system ground $G_S$, so that combining $G_L$ and $V_{FB}$ produces a voltage $V_{OUT}$, which is proportional to the inverse of the sensing capacitor $C_S$, but does not exhibit the cyclic voltage offset of $V_{FB}$.

FIG. 5 shows, in schematic form, one embodiment of the system of FIG. 1. Broken lines are used to encapsulate the corresponding elements from FIG. 1, i.e., switching network 102, voltage driving element 104, sensor network 106, and a feedback network 108. Note that the voltage driving element 104 is depicted in more detail as LM6132 in FIG. 5, and the constant reference voltage $V_{CR}$ shown in FIG. 1 is the voltage produced across a 5V zener diode.

The invention thus produces an output signal $V_{OUT}$ representative of the sensing capacitor $C_S$ in a manner similar to that of the '833 patent, but utilizes a voltage driving element 104 to drive the power supply rails of the feedback network with respect to the system ground, so that only components of relatively small physical size are needed. With this advantageous configuration, the invention is amenable to integrated circuit implementation.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A system for generating a signal which is a predetermined function of the capacitance of a sensor capacitor, comprising:

A. a sensor network including a reference capacitor and said sensor capacitor coupled in series, said reference capacitor being coupled between an input terminal and a junction terminal, and said sensor capacitor being coupled between said junction terminal and a system ground;

B. a switching network including a switch element having a first state and a second state, and a switch control having means for cyclically alternating said switch network between said first state and said second state;

C. a feedback network including an amplifier coupled by way of a demodulator to an integrator, said amplifier and integrator being coupled between an upper voltage supply terminal and a lower voltage supply terminal, said upper supply terminal being coupled to a first reference potential and said lower voltage supply terminal coupled to a second reference potential, said first reference potential being a fixed, predetermined voltage above said second reference potential and independent of said system ground, said feedback network being coupled to said sensor network and said switching network, and including means for generating a feedback signal at a feedback terminal, said feedback signal being representative of the difference in charge stored on said series capacitors from a predetermined value;

D. a voltage driving element for providing said first reference potential voltage, said driving means being responsive to at least one of a plurality of signals from said switching network;

wherein said switching network is operative to (i) electrically couple, while in said first state, an input of said voltage driving element with said feedback signal and said sensor input terminal with said second reference potential, and (ii) electrically couple, while in said second state, said input of said voltage driving element with said second reference potential, and said sensor input with a third reference potential, whereby an average change in charge stored on said series capacitors over each cycle is substantially equal to said predetermined value, said feedback signal being said predetermined function of the capacitance of said sensor capacitor.

2. A system according to claim 1 wherein said switching network comprises a double pole, double throw switch having a first pole and a second pole, said first pole being electrically connected to said input terminal of said sensor network and said second pole being electrically connected to an input of said voltage driving element, said first pole being switched between terminals maintained at said second and said third reference potentials, and said second pole being switched between said feedback terminal and a terminal maintained at said second reference potential, and wherein an input of said amplifier is coupled to the junction between said series capacitors.

3. A system according to claim 2 wherein said feedback network is coupled to the junction between said series capacitors by way of an A.C. coupling network.

4. A system according to claim 2 wherein said double pole, double throw switch is a solid state element.

5. A system according to claim 2 wherein said feedback network includes a demodulator coupled to said series capacitor junction and adapted to demodulate the signal produced at said junction.

6. A system according to claim 5 wherein said demodulator is coupled to said junction via a first difference amplifier having a non-inverting input maintained at said first reference potential, and an inverting input coupled to said series capacitor junction.

7. A system according to claim 6 wherein said second potential is a ground potential local to said feedback network.

8. A system according to claim 5 wherein said demodulator is operative in synchronism with said cyclical operation of said switching network.

9. A system according to claim 2 wherein said second potential is a ground potential local to said feedback network.

10. A system according to claim 1 wherein said feedback network includes a first difference amplifier having an inverting input terminal and a non-inverting input terminal, said inverting input terminal being coupled to the junction between said series capacitors.

11. A system according to claim 10 wherein said inverting input terminal is coupled to the junction between said series capacitors by way of an A.C. coupling network.

12. A system according to claim 10 wherein said switching element comprises a double pole, double throw switch having a first pole and a second pole, said first pole being electrically connected to said input terminal of said sensor network and said second pole being electrically connected to an input of said voltage driving element, said first pole being switched between terminals maintained at said second and said third reference potentials, and said second pole being switched between a terminal maintained at said second reference potential and said feedback terminal;

wherein an input of said amplifier is coupled to the junction between said series capacitors.

13. A system according to claim 12 wherein said double pole, double throw switch is a solid state element.

14. A system according to claim 12 wherein said feedback network includes a demodulator coupled to said first difference amplifier and adapted to demodulate the signal produced by said difference amplifier.

15. A system according to claim 14 wherein said demodulator is operative in synchronism with said cyclical operation of said switching network.

16. A system according to claim 1 wherein said series capacitors comprise a differential capacitor element having two fixed plate terminals and a movable plate terminal, and wherein said switching network comprises a double pole, double throw switch having a first pole and a second pole, said first pole being electrically connected to said input terminal of said sensor network and said second pole being electrically connected to an input of said voltage driving element, said first pole being switched between a terminal maintained at said second and said third reference potentials, and said second terminal being switched between said feedback terminal and a terminal maintained at said second reference potential, and wherein an input of said amplifier is coupled to said movable plate terminal.

17. A system according to claim 16 wherein said differential capacitor element includes two fixed plates, each being connected to an associated one of said fixed plate terminals, and includes a conductive diaphragm between said fixed plates, said diaphragm being connected to said movable plate terminal.

18. A system according to claim 16 wherein said double pole, double throw switch means is a solid state element.

19. A system according to claim 16 wherein said feedback network includes a demodulator coupled to said movable plate terminal and adapted to demodulate the signal produced at said movable plate terminal.

20. A system according to claim 19 wherein said demodulator is coupled to said movable plate terminal by a first difference amplifier having a non-inverting input terminal and means to maintain said non-inverting input terminal at a reference potential between said first and second reference potentials, and an inverting terminal coupled to said movable plate terminal.

21. A system according to claim 20 wherein said first and second potentials are characterized by opposite polarity, and wherein said non-inverting input terminal is maintained at ground potential.

22. A system according to claim 19 wherein said demodulator is operative in synchronism with said cyclical operation of said switching network.

23. A system for generating a signal which is a predetermined function of the capacitance of a sensor capacitor, comprising:

A. a sensor network including two series connected capacitors, one of said series capacitors being said sensor capacitor having one terminal electrically connected to a system ground;

B. a switching network including a switch element having two states and a switch control having means to cyclically alternate said switch network between said two states;

C. a feedback network having an upper voltage supply terminal coupled to a first reference potential, a lower voltage supply terminal coupled to a second reference potential, said first reference potential being a fixed, predetermined voltage above said second reference potential and independent of said system ground, said feedback network being coupled to said sensor network and said switching network, including means to generate a feedback signal at a feedback terminal, said feedback signal being representative of the difference in charge stored on said series capacitors from a second predetermined value;

D. a voltage-driving element for providing said second reference potential voltage, said driving element being responsive to at least one of a plurality of signals from said switching network;

wherein said switching network is operative to (i) electrically couple, while in said first state, an input of said voltage-driving element with said feedback signal and said sensor input terminal with said second reference potential, and (ii) electrically couple, while in said second state, said input of said voltage-driving element with said second reference potential, and said sensor input with a third reference potential, whereby an average change in charge stored on said series capacitors over each cycle is substantially equal to said predetermined value, said feedback signal being said predetermined function of the capacitance of said sensor capacitor.

* * * * *